(12) United States Patent
Yoshikawa et al.

(10) Patent No.: US 10,907,066 B2
(45) Date of Patent: Feb. 2, 2021

(54) CURABLE COMPOSITION FOR INK-JET PRINTING, CURED OBJECT, AND PRINTED WIRING BOARD

(71) Applicant: TAIYO INK MFG. CO., LTD., Saitama (JP)

(72) Inventors: Rina Yoshikawa, Saitama (JP); Masato Yoshida, Saitama (JP); Masayuki Shimura, Saitama (JP); Hiroshi Matsumoto, Saitama (JP)

(73) Assignee: TAIYO INK MFG. CO., LTD., Saitama (JP)

( * ) Notice: Subject to any disclaimer, the term of this patent is extended or adjusted under 35 U.S.C. 154(b) by 42 days.

(21) Appl. No.: 16/089,710

(22) PCT Filed: Feb. 9, 2017

(86) PCT No.: PCT/JP2017/004809
§ 371 (c)(1),
(2) Date: Sep. 28, 2018

(87) PCT Pub. No.: WO2017/169166
PCT Pub. Date: Oct. 5, 2017

(65) Prior Publication Data
US 2019/0071581 A1 Mar. 7, 2019

(30) Foreign Application Priority Data

Mar. 31, 2016 (JP) ................. 2016-073299

(51) Int. Cl.
*C09D 11/38* (2014.01)
*H05K 3/28* (2006.01)
*B41M 5/00* (2006.01)
*C09D 11/36* (2014.01)
*C09D 11/101* (2014.01)
*C09D 11/107* (2014.01)

(52) U.S. Cl.
CPC .............. *C09D 11/38* (2013.01); *B41M 5/00* (2013.01); *C09D 11/101* (2013.01); *C09D 11/107* (2013.01); *C09D 11/36* (2013.01); *H05K 3/28* (2013.01)

(58) Field of Classification Search
CPC ....... C09D 11/38; C09D 11/36; C09D 11/101; C09D 11/107; H05K 3/28; B41J 2/01; B41M 5/00
See application file for complete search history.

(56) References Cited

U.S. PATENT DOCUMENTS

| 2006/0187285 | A1  | 8/2006  | Oyanagi et al. |
| 2013/0216726 | A1  | 8/2013  | Ueda et al. |
| 2014/0035995 | A1* | 2/2014  | Chou ................. B41J 2/01 347/20 |
| 2015/0093690 | A1  | 4/2015  | Shimura et al. |
| 2015/0368493 | A1  | 12/2015 | Yamada |
| 2016/0237282 | A1  | 8/2016  | Shimura et al. |
| 2018/0206342 | A1* | 7/2018  | Torfs .................... C09D 11/322 |

FOREIGN PATENT DOCUMENTS

| EP | 2 439 244 A1 | 4/2012 |
| EP | 2 915 856 A1 | 9/2015 |
| JP | 2012-214532 A | 11/2012 |
| JP | 2014-136795 A | 7/2014 |
| JP | 2015-30796 A | 2/2015 |
| JP | 2015-67794 A | 4/2015 |
| JP | 2015-90903 A | 5/2015 |
| JP | 2015-110765 A | 6/2015 |
| JP | 2015-160923 A | 9/2015 |
| JP | 2015-173269 A | 10/2015 |
| WO | WO 2012/039372 A1 | 3/2012 |

OTHER PUBLICATIONS

International Search Report dated Apr. 11, 2017 in PCT/JP2017/004809 filed Feb. 9, 2017.
Extended European Search Report dated Dec. 9, 2019, in Patent Application No. 17773714.5, 6 pages.

* cited by examiner

*Primary Examiner* — Sanza L. McClendon
(74) *Attorney, Agent, or Firm* — Oblon, McClelland, Maier & Neustadt, L.L.P.

(57) ABSTRACT

Provided are a curable composition for inkjet, which not only allows surface curability in formation of a coating film by an inkjet system to be enhanced, but also is not reduced in characteristics conventionally provided, such as solder heat resistance and gold plating resistance, and a cured product and a printed wiring board using the curable composition. The curable composition for inkjet of the present invention includes (A) an alkylene chain-containing bifunctional (meth)acrylate compound, (B) an α-aminoalkylphenone-based photopolymerization initiator, and (C) an acylphosphine oxide-based photopolymerization initiator, wherein, when the thickness is 10 μm, the absorbance at a wavelength of 365 nm is 0.08 to 0.8 and the absorbance at a wavelength of 385 nm is 0.05 to 0.3.

20 Claims, No Drawings

CURABLE COMPOSITION FOR INK-JET PRINTING, CURED OBJECT, AND PRINTED WIRING BOARD

TECHNICAL FIELD

The present invention relates to a curable composition for inkjet, and a cured product and a printed wiring board using the curable composition.

BACKGROUND ART

In the case of formation of an etching resist, a solder resist, a symbol marking, or the like on a printed wiring board, a procedure has been commonly adopted where a base plate is coated with a composition high in viscosity by a printing method such as screen printing and thereafter an ink is cured by irradiation with an active energy ray.

In recent years, a method for forming the etching resist, the solder resist, the symbol marking, or the like by an inkjet system instead of screen printing has been developed. An inkjet system is characterized in that the amount of an ink used can be reduced, a plate for screen printing is also unnecessary, and direct lithography from digital data can be made. In addition, an UV irradiation device can be attached to a head of an inkjet printer or the vicinity thereof, to thereby allow pattern printing and temporary curing by UV to be simultaneously performed, and also allow the time taken for such a process to be reduced. There are demanded for physical properties different from those of a curable composition for use in a conventional printing method in consideration of discharge through an inkjet nozzle.

For example, there is a curable composition for inkjet where the viscosity is as low as 150 mPa·s or less at 25° C. (Patent Document 1).

RELATED ART DOCUMENT

Patent Document

Patent Document 1: JP-A-2012-214532

SUMMARY OF THE INVENTION

Problems to be Solved by the Invention

A coating film of a curable composition, obtained by coating according to an inkjet system, is susceptible to oxygen in the air. Therefore, the surface curability of the coating film in curing by irradiation with an active energy ray may be deteriorated due to the influence of oxygen inhibition or the like, consequently causing blurring to occur on a pattern of the composition, formed by the inkjet system, and/or causing a stage and the like of an inkjet apparatus to be contaminated in reverse of a base plate. On the other hand, if the cumulative amount of light of the active energy ray is increased in order to enhance the surface curability of the coating film, the surface curability of the coating film is improved, but blurring occurs in the same way. In addition, if the amount of a photopolymerization initiator is increased in order to enhance the surface curability of the coating film, a problem is that various characteristics such as solder heat resistance and gold plating resistance are reduced.

The present invention is to effectively solve the above problems, and an object thereof is to provide a curable composition for inkjet, which not only allows surface curability in formation of a coating film by an inkjet system to be enhanced, but also is not reduced in characteristics conventionally provided, such as solder heat resistance and gold plating resistance, as well as a cured product and a printed wiring board using the curable composition.

Means for Solving the Problems

The present inventors have made intensive studies in order to solve the above problems, and as a result, have found that a composition suitable for inkjet printing can be obtained using an alkylene chain-containing bifunctional (meth)acrylate monomer, and favorable surface curability and coating film characteristics can be achieved by adjusting the absorbance within a proper range by a combination of an aminoalkylphenone-based photopolymerization initiator with an acylphosphine oxide-based photopolymerization initiator, thereby providing the curable composition for inkjet of the present invention.

A curable composition for inkjet of the present invention includes (A) an alkylene chain-containing bifunctional (meth)acrylate compound, (B) an α-aminoalkylphenone-based photopolymerization initiator, and (C) an acylphosphine oxide-based photopolymerization initiator, wherein, when the thickness is 10 µm, the absorbance at a wavelength of 365 nm is 0.08 to 0.8 and the absorbance at a wavelength of 385 nm is 0.05 to 0.3. Here, "the thickness is 10 µm" means that the thickness before light irradiation for curing is 10 µm.

In the curable composition for inkjet of the present invention, the number of carbon atoms in the alkylene chain of the (A) alkylene chain-containing bifunctional (meth) acrylate compound is preferably 4 to 12.

Moreover, the curable composition for inkjet of the present invention can further include (D) a bisphenol type epoxy (meth)acrylate compound.

Furthermore, in the curable composition for inkjet of the present invention, the viscosity at 50° C. is preferably 50 mPa·s or less.

A cured product of the present invention is obtained by irradiating the curable composition for inkjet with light.

A printed wiring board of the present invention includes a cured product obtained by forming the curable composition for inkjet on a base plate and irradiating it with light.

Effects of the Invention

According to the present invention, there can be obtained a curable composition for inkjet, which not only allows surface curability of a coating film by an inkjet system to be enhanced, but also is not reduced in characteristics conventionally provided, such as solder heat resistance and gold plating resistance. In addition, the curable composition for inkjet of the present invention can be irradiated with light to thereby provide a cured product. Furthermore, the curable composition for inkjet of the present invention can be included in the cured product by formation thereof on a base plate of a printed wiring board and irradiation thereof with light.

MODE FOR CARRYING OUT THE INVENTION

The curable composition for inkjet of the present invention includes (A) an alkylene chain-containing bifunctional (meth)acrylate compound, (B) an α-aminoalkylphenone-based photopolymerization initiator, and (C) an acylphosphine oxide-based photopolymerization initiator, wherein, when the thickness is 10 µm, the absorbance at a wavelength of 365 nm is 0.08 to 0.8 and the absorbance at a wavelength of 385 nm is 0.05 to 0.3.

Herein, (meth)acrylate collectively refers to acrylate, methacrylate, and a mixture thereof, and much the same is true on other similar expressions.

[(A) Alkylene Chain-Containing Bifunctional (Meth)Acrylate Compound]

The curable composition for inkjet of the present invention includes an alkylene chain-containing bifunctional (meth)acrylate compound. The alkylene chain-containing bifunctional (meth)acrylate compound is preferably one having no hydroxyl group. The alkylene chain-containing bifunctional (meth)acrylate compound is included, thereby enabling a composition suitable for inkjet printing and low in viscosity to be obtained.

Specific examples of the alkylene chain-containing bifunctional (meth)acrylate include diol diacrylates such as 1,4-butanediol diacrylate, 1,6-hexanediol diacrylate, 1,9-nonanediol diacrylate, and 1,10-decanediol diacrylate.

Examples of commercially available products include NK Ester A-NOD-N (trade name, manufactured by SHIN NAKAMURA CHEMICAL CO., LTD.), LIGHT ACRYLATE 1,6HX-A and 1,9ND-A (trade names, manufactured by KYOEISHA CHEMICAL Co., LTD.), and HDDA and 1,9-NDA (trade names, manufactured by DAICEL-ALLNEX LTD.).

The amount of such an alkylene chain-containing bifunctional (meth)acrylate compound compounded is preferably 20 to 90 parts by mass, more preferably 40 to 80 parts by mass, in 100 parts by mass of the curable composition. When the amount of the bifunctional (meth)acrylate compounded is 20 parts by mass or more, compatibility of an ink is improved. On the other hand, when the amount compounded is 90 parts by mass or less, adhesiveness of an ink is improved.

The viscosity of the alkylene chain-containing bifunctional (meth)acrylate compound at 25° C. is preferably 5 to 50 mPa·s, particularly preferably 5 to 30 mPa·s. When the viscosity is in the range, handleability of the bifunctional (meth)acrylate compound as a diluent can be improved, thereby allowing for uniform mixing of each component. As a result, the entire surface of the coating film can be expected to evenly adhere to a base plate.

[(B) α-Aminoalkylphenone-Based Photopolymerization Initiator]

The curable composition for inkjet of the present invention includes an α-aminoalkylphenone-based photopolymerization initiator as one of the photopolymerization initiators.

Specific examples of the α-aminoalkylphenone-based photopolymerization initiator include α-aminoacetophenone-based photopolymerization initiators such as 2-methyl-1-[4-(methylthio)phenyl]-2-morpholinopropanone-1,2-benzyl-2-dimethylamino-1-(4-morpholinophenyl)-butane-1-one, 2-(dimethylamino)-2-[(4-methylphenyl)methyl]-1-[4-(4-morpholinyl)phenyl]-1-butanone, and N,N-dimethylaminoacetophenone, and examples of commercially available products include IRGACURE® 369, IRGACURE® 379, and IRGACURE® 907 manufactured by BASF Japan Ltd.

The compounding rate of the (B) α-aminoalkylphenone-based photopolymerization initiator is preferably in the range from 1 to 10 parts by mass, in 100 parts by mass of the curable composition.

[(C) Acylphosphine Oxide-Based Photopolymerization Initiator]

The curable composition for inkjet of the present invention includes an acylphosphine oxide-based photopolymerization initiator as one of the photopolymerization initiators.

Specific examples of the acylphosphine oxide-based photopolymerization initiator include 2,4,6-trimethylbenzoyldiphenylphosphine oxide, bis(2,4,6-trimethylbenzoyl)-phenylphosphine oxide, and bis(2,6-dimethoxybenzoyl)-2,4,4-trimethyl-pentylphosphine oxide. Examples of commercially available products include IRGACURE® TPO and IRGACURE® 819 manufactured by BASF Japan Ltd.

The compounding rate of the (C) acylphosphine oxide-based photopolymerization initiator is preferably in the range from 1 to 10 parts by mass, in 100 parts by mass of the curable composition.

The (B) α-aminoalkylphenone-based photopolymerization initiator and the (C) acylphosphine oxide-based photopolymerization initiator can be used in combination as a photopolymerization initiator, thereby allowing for adjustment to a proper absorbance described below and achieving favorable surface curability and coating film characteristics.

The compounding rate of the (B) α-aminoalkylphenone-based photopolymerization initiator is preferably higher than that of the (C) acylphosphine oxide-based photopolymerization initiator. The compounding rate of the (B) α-aminoalkylphenone-based photopolymerization initiator can be higher, thereby resulting in suppression of a reduction in surface curability due to the influence of oxygen and the like, to provide a cured film excellent in pencil hardness and the like.

The (B) α-aminoalkylphenone-based photopolymerization initiator and the (C) acylphosphine oxide-based photopolymerization initiator can be each used singly or as a mixture of two or more kinds thereof, and furthermore a photoinitiator aid, for example, tertiary amine such as N,N-dimethylaminobenzoic acid ethyl ester, N,N-dimethylaminobenzoic acid isoamyl ester, pentyl-4-dimethylaminobenzoate, triethylamine, and triethanolamine can be added.

The curable composition for inkjet of the present invention includes the alkylene chain-containing bifunctional (meth)acrylate compound, thereby enabling a composition suitable for inkjet printing and low in viscosity to be obtained, and also the ca-aminoalkylphenone-based photopolymerization initiator and the acylphosphine oxide-based photopolymerization initiator can be used in combination, thereby allowing for adjustment to the following appropriate absorbance: when the thickness is 10 µm, the absorbance at a wavelength of 365 nm is 0.08 to 0.8 and the absorbance at a wavelength of 385 nm is 0.05 to 0.3; and achieving favorable surface curability and coating film characteristics. When the thickness is 10 µm, the absorbance at a wavelength of 365 nm is preferably 0.11 to 0.7 and the absorbance at a wavelength of 385 nm is preferably 0.06 to 0.3.

In the thickness of 10 µm, when an absorbance at a wavelength of 365 nm is 0.08 or more, favorable surface curability can be obtained, and when an absorbance at a wavelength of 365 nm is 0.8 or less, favorable inkjet printability, solder heat resistance and gold plating resistance can be obtained, and furthermore when an absorbance at a wavelength of 385 nm is 0.05 or more, favorable surface curability can be obtained, and when an absorbance at a wavelength of 385 nm is 0.3 or less, favorable inkjet printability, solder heat resistance and gold plating resistance can be obtained.

The curable composition for inkjet of the present invention can include various components other than the above components. Also in this case, the curable composition for inkjet of the present invention is importantly adjusted in terms of the materials and the compounding rates thereof so that each absorbance is in the above numerical value range.

[Bisphenol Type Epoxy (Meth)Acrylate Compound]

The bisphenol type epoxy (meth)acrylate compound is a compound where (meth)acrylic acid is partially added to a bisphenol type epoxy compound, and specific examples include trade name EA-1010N manufactured by SHIN NAKAMURA CHEMICAL CO., LTD., which is a compound where acrylic acid is added to one epoxy group of a bisphenol A type epoxy resin. In particular, a monofunctional (meth)acrylate compound is preferably used from the viewpoint of easiness of viscosity adjustment and the like. The bisphenol type epoxy (meth)acrylate compound can be used singly or in combination of a plurality of kinds thereof.

The compounding rate of the bisphenol type epoxy (meth)acrylate compound is preferably in the range from 5 to 30 parts by mass, in 100 parts by mass of the curable composition.

The bisphenol type epoxy (meth)acrylate compound is included, thereby allowing a composition suitable for inkjet coating, low in viscosity, and favorable in various characteristics to be obtained.

[Hydroxyl Group-Containing (Meth)Acrylate Compound]

The curable composition for inkjet of the present invention can include a hydroxyl group-containing (meth)acrylate compound. As the hydroxyl group-containing (meth)acrylate compound, a low molecular weight material such as a monomer or an oligomer is used, and specifically, a material whose molecular weight is in the range from 100 to 1000, preferably in the range from 110 to 700, is used.

Specific examples of the hydroxyl group-containing (meth)acrylate compound include 2-hydroxy-3-acryloyloxypropyl (meth)acrylate, 2-hydroxy-3-phenoxyethyl (meth)acrylate, 1,4-cyclohexane dimethanol mono(meth)acrylate, 2-hydroxyethyl (meth)acrylate, 2-hydroxypropyl (meth)acrylate, 4-hydroxybutyl (meth)acrylate, pentaerythritol tri(meth)acrylate, dipentaerythritol monohydroxy penta(meth)acrylate, and 2-hydroxypropyl (meth)acrylate. Examples of commercially available products include Alonix® M-5700 (trade name, manufactured by TOAGOSEI CO., LTD.), 4HBA, 2HEA and CHDMMA (all are trade names, manufactured by Nihon Kasei CO., LTD.), BHEA, HPA, HEMA and HPMA (all are trade names, manufactured by NIPPON SHOKUBAI CO., LTD.), and LIGHT ESTER HO, LIGHT ESTER HOP and LIGHT ESTER HOA (all are trade names, manufactured by KYOEISHA CHEMICAL Co., LTD.). The hydroxyl group-containing (meth)acrylate compound can be used singly or in combination of a plurality of kinds thereof.

Among them, in particular, 2-hydroxy-3-acryloyloxypropyl acrylate, 2-hydroxy-3-phenoxyethyl acrylate, 2-hydroxyethyl acrylate, 2-hydroxypropyl acrylate, 4-hydroxybutyl acrylate, and 1,4-cyclohexane dimethanol monoacrylate are preferably used. In addition, a monofunctional (meth)acrylate compound is preferably used from the viewpoint of easiness of viscosity adjustment and the like.

The amount of the hydroxyl group-containing (meth)acrylate compound compounded is preferably 1 to 20 parts by mass, more preferably 2 to 10 parts by mass, in 100 parts by mass of the curable composition. When the amount of the hydroxyl group-containing (meth)acrylate compounded is 1 part by mass or more, the adhesiveness of the composition is more improved. On the other hand, when the amount compounded is 20 parts by mass or less, a reduction in compatibility of an ink can be suppressed.

A diluent, besides the (meth)acrylate compound, can be appropriately compounded to the curable composition for inkjet of the present invention for the purpose of adjusting the viscosity of the composition.

Examples of the diluent include a dilution solvent, a photoreactive diluent, and a thermal reactive diluent. Among such diluents, a photoreactive diluent is preferable.

Examples of the photoreactive diluent include compounds having an unsaturated double bond, an oxetanyl group, or an epoxy group, such as (meth)acrylates, vinyl ethers, ethylene derivatives, styrene, chloromethylstyrene, α-methylstyrene, maleic anhydride, dicyclopentadiene, N-vinyl pyrrolidone, N-vinyl formamide, xylylene dioxetane, oxetane alcohol, 3-ethyl-3-(phenoxymethyl)oxetane, and resorcinol diglycidyl ether.

Among them, (meth)acrylates are preferable, and monofunctional (meth)acrylates are further preferable. Examples of the monofunctional (meth)acrylates include (meth)acrylates such as methyl (meth)acrylate, ethyl (meth)acrylate, butyl (meth)acrylate, isobutyl (meth)acrylate, lauryl (meth)acrylate, stearyl(meth)acrylate, 2-hydroxyethyl (meth)acrylate, hydroxypropyl (meth)acrylate, hydroxybutyl (meth)acrylate and glycidyl methacrylate, and acryloylmorpholine.

The curable composition for inkjet of the present invention may also include (meth)acrylates having a cyclic backbone. Examples of the (meth)acrylates having a cyclic backbone include (meth)acrylate having a cyclic hydrocarbon structure and (meth)acrylate having a heterocyclic structure including a nitrogen atom, an oxygen atom, and the like.

A tri- or higher functional (meth)acrylate compound (except for one having a hydroxyl group) can be compounded to the curable composition for the purpose of enhancing tackiness after UV curing of the composition.

Examples of the tri- or higher functional (meth)acrylate compound include trimethylolpropane triacrylate, trimethylolmethane triacrylate, ethylene oxide-modified trimethylolpropane triacrylate, propylene oxide-modified trimethylolpropane triacrylate, epichlorohydrin-modified trimethylolpropane triacrylate, pentaerythritol tetraacrylate, tetramethylolmethane tetraacrylate, ethylene oxide-modified phosphate triacrylate, propylene oxide-modified phosphate triacrylate, epichlorohydrin-modified glycerol triacrylate, dipentaerythritol hexaacrylate, ditrimethylolpropane tetraacrylate, or polyfunctional acrylate typified by silsesquioxane-modified products thereof, or methacrylate monomers and ε-caprolactone-modified trisacryloxyethyl isocyanurates corresponding thereto.

[Thermosetting Component]

A thermosetting component can be added to the curable composition. The thermosetting component can be added to thereby allow enhancements in adhesiveness and heat resistance to be expected. The thermosetting component for use in the present invention can be a known thermosetting resin, for example, an amino resin such as a melamine resin, a benzoguanamine resin, a melamine derivative or a benzoguanamine derivative, a block isocyanate compound, a cyclocarbonate compound, a cyclic (thio)ether group-containing thermosetting component, bismaleimide, or a carbodiimide resin. Beside them, a benzene ring-containing aromatic amine, a reaction product of an amine compound with an epoxy compound, or the like may be used. A block isocyanate compound is particularly preferable because of being excellent in storage stability.

The thermosetting component having a plurality of cyclic (thio)ether groups in the molecule is a compound having a plurality of any one or two kinds of groups of 3-, 4- or 5-membered cyclic (thio)ether groups, and examples thereof include a compound having a plurality of epoxy groups in the molecule, namely, a polyfunctional epoxy compound, a compound having a plurality of oxetanyl groups in the molecule, namely, a polyfunctional oxetane compound, and a compound having a plurality of thioether groups in the molecule, namely, an episulfide resin.

Examples of the polyfunctional epoxy compound include epoxylated vegetable oils such as Adekacizer O-130P, Adekacizer O-180A, Adekacizer D-32 and Adekacizer D-55 manufactured by ADEKA CORPORATION; bisphenol A type epoxy resins such as jER® 828, jER® 834, jER® 1001 and jER® 1004 manufactured by Mitsubishi Chemical Corporation, EHPE3150 manufactured by Daicel Corporation, EPICLON 840, EPICLON 850, EPICLON 1050 and EPICLON 2055 manufactured by DIC CORPORATION, EPOTOHTO YD-011, YD-013, YD-127 and YD-128 manufactured by Tohto Chemical Industry Co., Ltd., D.E.R.317, D.E.R.331, D.E.R.661 and D.E.R.664 manufactured by Dow Chemical Company, SUMIEPOXY® ESA-011, ESA-014, ELA-115 and ELA-128 manufactured by Sumitomo Chemical Co., Ltd., and A.E.R.330, A.E.R.331, A.E.R.661 and A.E.R.664 (all are trade names) manufactured by Asahi Kasei Corporation; a hydroquinone type epoxy resin, YDC-1312, a bisphenol type epoxy resin, YSLV-80XY, and a thioether type epoxy resin, YSLV-120TE (all are manufactured by Tohto Chemical Industry Co., Ltd.); bromated epoxy resins such as jER® YL903 manufactured by Mitsubishi Chemical Corporation, EPICLON 152 and EPICLON 165 manufactured by DIC CORPORATION, EPOTOHTO YDB-400 and YDB-500 manufactured by Tohto Chemical Industry Co., Ltd., D.E.R.542 manufactured by Dow Chemical Company, SUMIEPOXY® ESB-400 and ESB-700 manufactured by Sumitomo Chemical Co., Ltd., and A.E.R.711 and A.E.R.714 (all are trade names) manufactured by Asahi Kasei Corporation; novolac type epoxy resins such as jER® 152 and jER® 154 manufactured by Mitsubishi Chemical Corporation, D.E.N.431 and D.E.N.438 manufactured by Dow Chemical Company, EPICLON N-730, EPICLON N-770 and EPICLON N-865 manufactured by DIC CORPORATION, EPOTOHTO YDCN-701 and YDCN-704 manufactured by Tohto Chemical Industry Co., Ltd., EPPN-201, EOCN-1025, EOCN-1020, EOCN-104S and RE-306 manufactured by Nippon Kayaku Co., Ltd., SUMIEPOXY® ESCN-195X and ESCN-220 manufactured by Sumitomo Chemical Co., Ltd., and A.E.R.ECN-235 and ECN-299 (all are trade names) manufactured by Asahi Kasei Corporation; biphenol novolac type epoxy resins such as NC-3000 and NC-3100 manufactured by Nippon Kayaku Co., Ltd.; bisphenol F type epoxy resins such as EPICLON 830 manufactured by DIC CORPORATION, jER® 807 manufactured by Mitsubishi Chemical Corporation, and EPOTOHTO YDF-170, YDF-175 and YDF-2004 (all are trade names) manufactured by Tohto Chemical Industry Co., Ltd.; hydrogenated bisphenol A type epoxy resins such as EPOTOHTO ST-2004, ST-2007 and ST-3000 (trade names) manufactured by Tohto Chemical Industry Co., Ltd.; glycidylamine type epoxy resins such as jER® 604 manufactured by Mitsubishi Chemical Corporation, EPOTOHTO YH-434 manufactured by Tohto Chemical Industry Co., Ltd., and SUMIEPOXY® ELM-120 (trade name) manufactured by Sumitomo Chemical Co., Ltd.; hydantoin type epoxy resins; alicyclic epoxy resins such as Ceroxide 2021 (trade name) manufactured by Daicel Corporation; trihydroxyphenylmethane type epoxy resins such as YL-933 manufactured by Mitsubishi Chemical Corporation, and T.E.N., EPPN-501 and EPPN-502 (all are trade names) manufactured by Dow Chemical Company; bixylenol type or biphenol type epoxy resins, or mixtures thereof, such as YL-6056, YX-4000 and YL-6121 (all are trade names) manufactured by Mitsubishi Chemical Corporation; bisphenol S type epoxy resins such as EBPS-200 manufactured by Nippon Kayaku Co., Ltd., EPX-30 manufactured by ADEKA CORPORATION, and EXA-1514 (trade name) manufactured by DIC CORPORATION; bisphenol A novolac type epoxy resins such as jER® 157S (trade name) manufactured by Mitsubishi Chemical Corporation; tetraphenylolethane type epoxy resins such as jER® YL-931 (trade name) manufactured by Mitsubishi Chemical Corporation; heterocyclic epoxy resins such as TEPIC (trade name) manufactured by Nissan Chemical Corporation; diglycidyl phthalate resins such as BLEMMER® DGT manufactured by NOF CORPORATION; tetraglycidyl xylenoylethane resins such as ZX-1063 manufactured by Tohto Chemical Industry Co., Ltd.; naphthalene group-containing epoxy resins such as ESN-190 and ESN-360 manufactured by NIPPON STEEL & SUMIKIN CHEMICAL CO., LTD., and HP-4032, EXA-4750 and EXA-4700 manufactured by DIC CORPORATION; dicyclopentadiene backbone-containing epoxy resins such as HP-7200 and HP-7200H manufactured by DIC CORPORATION; glycidyl methacrylate-copolymerized epoxy resins such as CP-50S and CP-50M manufactured by NOF CORPORATION; and also copolymerized epoxy resins of cyclohexyl maleimide with glycidyl methacrylate; as well as epoxy-modified polybutadiene rubber derivatives (such as PB-3600 manufactured by Daicel Corporation) and CTBN-modified epoxy resins (such as YR-102 and YR-450 manufactured by Tohto Chemical Industry Co., Ltd.), but are not limited thereto. These epoxy resins can be used singly or in combination of two or more kinds thereof. Among them, in particular, a novolac type epoxy resin, a bixylenol type epoxy resin, a biphenol type epoxy resin, a biphenol novolac type epoxy resin, a naphthalene type epoxy resin, or a mixture thereof is preferable.

Examples of the polyfunctional oxetane compound include not only bis[(3-methyl-3-oxetanylmethoxy)methyl] ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3-oxetanyl)methyl methacrylate, (3-ethyl-3-oxetanyl)methyl methacrylate, and polyfunctional oxetanes such as oligomers or copolymers thereof, but also etherified products of oxetane alcohols with hydroxyl group-containing resins such as a novolac resin, poly(p-hydroxystyrene), cardo type bisphenols, calixarenes, calixresorcinarenes, or silsesquioxane. Other examples include a copolymer of an oxetane ring-containing unsaturated monomer with alkyl (meth)acrylate.

Examples of the compound having a plurality of cyclic thioether groups in the molecule include a bisphenol A type episulfide resin YL7000 manufactured by Mitsubishi Chemical Corporation. In addition, an episulfide resin or the like where an oxygen atom of an epoxy group of a novolac type epoxy resin is substituted with a sulfur atom by using a similar synthesis method can also be used.

Examples of the amino resin such as a melamine derivative or a benzoguanamine derivative include a methylolmelamine compound, a methylolbenzoguanamine compound, a methylol glycol uryl compound, and a methylol urea compound. Furthermore, an alkoxymethylated melamine compound, an alkoxymethylated benzoguanamine compound, an alkoxymethylated glycol uryl compound, and an alkoxymethylated urea compound are obtained by converting respective methylol groups of a methylol melamine compound, a methylol benzoguanamine compound, a methylol glycol uryl compound, and a methylol urea compound to alkoxymethyl groups. The type of the alkoxymethyl group is not particularly limited, and for example, a methoxymethyl group, an ethoxymethyl group, a propoxymethyl group, a butoxymethyl group, and the like can be adopted. In particular, a human body- or environment-friendly melamine derivative having a formalin concentration of 0.2% or less is preferable.

Examples of commercially available products thereof can include CYMEL 300, CYMEL 301, CYMEL 303, CYMEL 370, CYMEL 325, CYMEL 327, CYMEL 701, CYMEL 266, CYMEL 267, CYMEL 238, CYMEL 1141, CYMEL 272, CYMEL 202, CYMEL 1156, CYMEL 1158, CYMEL 1123, CYMEL 1170, CYMEL 1174 and CYMEL UFR65 (all are manufactured by Mitsui Cyanamid Co., Ltd.), and NIKALAC Mx-750, NIKALAC Mx-032, NIKALAC Mx-270, NIKALAC Mx-280, NIKALAC Mx-290, NIKALAC Mx-706, NIKALAC Mx-708, NIKALAC Mx-40, NIKALAC Mx-31, NIKALAC Ms-11, NIKALAC Mw-30, NIKALAC Mw-30HM, NIKALAC Mw-390, NIKALAC Mw-100LM and NIKALAC Mw-750LM (all are manufactured by SANWA CHEMICAL CO., LTD.). Such thermosetting components may be used singly or in combination of two or more kinds thereof.

The isocyanate compound or the block isocyanate compound is a compound having a plurality of isocyanate groups or blocked isocyanate groups in one molecule, respectively. Examples of such a compound having a plurality of isocyanate groups or blocked isocyanate groups in one molecule include a polyisocyanate compound or a block isocyanate compound, respectively. Herein, the blocked isocyanate group is a group which is protected by a reaction of an isocyanate group with a blocking agent and thus temporarily inactivated, and, when heated to a predetermined temperature, dissociates the blocking agent to generate an isocyanate group. It has been confirmed that the polyisocyanate compound or the block isocyanate compound is added to thereby enhance curability and the toughness of a cured product obtained.

As such a polyisocyanate compound, for example, aromatic polyisocyanate, aliphatic polyisocyanate, or alicyclic polyisocyanate is used.

Specific examples of the aromatic polyisocyanate include 4,4'-diphenylmethane diisocyanate, 2,4-tolylene diisocyanate, 2,6-tolylene diisocyanate, naphthalene-1,5-diisocyanate, o-xylylene diisocyanate, m-xylylene diisocyanate, and a 2,4-tolylene dimer.

Specific examples of the aliphatic polyisocyanate include tetramethylene diisocyanate, hexamethylene diisocyanate, methylene diisocyanate, trimethylhexamethylene diisocyanate, 4,4-methylenebis(cyclohexyl isocyanate), and isophorone diisocyanate.

Specific examples of the alicyclic polyisocyanate include bicycloheptane triisocyanate, as well as an adduct product, a biuret product, and an isocyanurate product of any isocyanate compound listed above.

As the block isocyanate compound, an addition reaction product of an isocyanate compound with an isocyanate blocking agent is used. Examples of the isocyanate compound which can react with the blocking agent include the above polyisocyanate compounds.

Examples of the isocyanate blocking agent include phenol-based blocking agents such as phenol, cresol, xylenol, chlorophenol and ethylphenol; lactam-based blocking agents such as ε-caprolactam, δ-valerolactam, γ-butyrolactam and β-propiolactam; active methylene-based blocking agents such as ethyl acetoacetate and acetyl acetone; alcohol-based blocking agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate and ethyl lactate; oxime-based blocking agents such as formaldehyde oxime, acetoaldoxime, acetoxime, methyl ethyl ketoxime, diacetyl monoxime and cyclohexane oxime; mercaptan-based blocking agents such as butyl mercaptan, hexyl mercaptan, t-butyl mercaptan, thiophenol, methylthiophenol and ethylthiophenol; acid amide-based blocking agents such as acetic acid amide and benzamide; imide-based blocking agents such as succinic acid imide and maleic acid imide; amine-based blocking agents such as xylidine, aniline, butylamine and dibutylamine; imidazole-based blocking agents such as imidazole and 2-ethylimidazole; and imine-based blocking agents such as methyleneimine and propyleneimine.

The block isocyanate compound may be commercially available, and examples include SUMIDUR BL-3175, BL-4165, BL-1100 and BL-1265, DESMODUR TPLS-2957, TPLS-2062, TPLS-2078 and TPLS-2117, and DESMOSOME 2170 and DESMOSOME 2265 (all are manufactured by Sumika Bayer Urethane Co., Ltd.), CORONATE 2512, CORONATE 2513 and CORONATE 2520 (all are manufactured by Nippon Polyurethane Industry Co., Ltd.), B-830, B-815, B-846, B-870, B-874 and B-882 (all are manufactured by Mitsui Takeda Chemicals Inc.), and TPA-B80E, 17B-60PX and E402-B80T (all are manufactured by ASAHI KASEI CHEMICALS CORPORATION). Herein, SUMIDUR BL-3175 and BL-4265 are each obtained by using methyl ethyl oxime as the blocking agent. Such a compound having a plurality of isocyanate groups or blocked isocyanate groups in one molecule may be used singly or in combination of two or more kinds thereof.

The amount of such a thermosetting component compounded is 1 to 30 parts by mass, in 100 parts by mass of the curable composition. When the amount compounded is 1 part by mass or more, a coating film sufficient in toughness and heat resistance is obtained. On the other hand, when the amount is 30 parts by mass or less, a reduction in storage stability can be suppressed.

[Colorant]

The curable composition for inkjet of the present invention can include a conventionally known colorant such as phthalocyanine-blue, phthalocyanine-green, iodine-green, disazo yellow, crystal violet, titanium oxide, carbon black, and naphthalene black.

Such a colorant may be used singly or as a mixture of two or more kinds thereof, and the amount thereof compounded is 0.1 to 30 parts by mass, preferably 0.5 to 20 parts by mass with respect to 100 parts by mass of the non-volatile content of the curable composition for inkjet. When the amount of the colorant compounded is less than 0.1 parts by mass, visibility is inferior, and when the amount exceeds 30 parts by mass, such a case is not preferable because a reduction in photo-curability of the lower portion of a coating film is caused.

The type and the amount of the colorant compounded affect each absorbance of the curable composition for inkjet, and therefore are adjusted so that each absorbance is in a suitable range described above.

When a white pigment is included as the colorant, a known white pigment such as titanium oxide, zinc oxide, magnesium oxide, zirconium oxide, aluminum oxide, barium sulfate, silica, talc, mica, aluminum hydroxide, calcium silicate, aluminum silicate, a hollow resin particle, or zinc sulfide can be used. Among them, titanium oxide is preferable because of being high in colorability and reflection rate. Such a white pigment may be used singly or in combination of two or more kinds thereof. Titanium oxide may be rutile type titanium oxide or anatase type titanium oxide, and rutile type titanium is preferably used in terms of colorability, shieldability and stability. While anatase type titanium oxide which is again titanium oxide is high in whiteness as compared with rutile type titanium oxide and is often used as a white pigment, anatase type titanium oxide has photocatalytic activity and therefore may cause discoloration of a resin in an insulating resin composition particularly by light radiated from an LED. On the contrary, rutile type titanium oxide, while being slightly inferior in whiteness as compared with anatase type one, does not almost have photoactivity, and therefore allows degradation (yellowing) of the resin by light due to photoactivity of titanium oxide to be remarkably suppressed and also is stable toward heat. Thus, when rutile type titanium oxide is used as a white pigment in an insulation layer of a printed wiring board on which an LED is mounted, a high reflection rate can be maintained for a long period of time.

As such rutile type titanium oxide, known one can be used. Production methods of rutile type titanium oxide include two types: a sulfuric acid method and a chlorine method; and one produced by any of such methods can be suitably used in the present invention. Here, the sulfuric acid method refers to a production method where ilmenite ore or titanium slug is used as a raw material and is dissolved in concentrated sulfuric acid to separate the iron content as iron sulfate, the solution is hydrolyzed to thereby give a hydroxide precipitate, and the precipitate is fired at a high temperature to take out rutile type titanium oxide. On the other hand, the chlorine method refers to a production method where synthetic rutile or natural rutile is used as a raw material and is reacted with a chlorine gas and carbon at a high temperature of about 1000° C. to synthesize titanium tetrachloride, and the titanium tetrachloride is oxidized to take out rutile type titanium oxide. Among them, rutile type titanium oxide produced by the chlorine method remarkably exerts the suppression effect of degradation (yellowing) of the resin particularly by heat, and is more suitably used in the present invention.

As commercially available rutile type titanium oxide, there can be used Tipaque® R-820, Tipaque® R-830, Tipaque® R-930, Tipaque® R-550, Tipaque® R-630, Tipaque® R-680, Tipaque® R-670, Tipaque® R-780, Tipaque® R-850, Tipaque® CR-50, Tipaque® CR-57, Tipaque® CR-Super70, Tipaque® CR-80, Tipaque® CR-90, Tipaque® CR-93, Tipaque® CR-95, Tipaque® CR-97, Tipaque® CR-60, Tipaque® CR-63, Tipaque® CR-67, Tipaque® CR-58, Tipaque® CR-85 and Tipaque® UT771 (manufactured by ISHIHARA SANGYO KAISHA, LTD.), Ti-Pure® R-100, Ti-Pure® R-101, Ti-Pure® R-102, Ti-Pure® R-103, Ti-Pure® R-104, Ti-Pure® R-105, Ti-Pure® R-108, Ti-Pure® R-900, Ti-Pure® R-902, Ti-Pure® R-960, Ti-Pure® R-706 and Ti-Pure® R-931 (manufactured by DuPont), R-25, R-21, R-32, R-7E, R-5N, R-61N, R-62N, R-42, R-45M, R-44, R-49S, GTR-100, GTR-300, D-918, TCR-29, TCR-52 and FTR-700 (manufactured by SAKAI CHEMICAL INDUSTRY CO., LTD.), and the like.

In particular, Tipaque® CR-50, Tipaque® CR-57, Tipaque® CR-80, Tipaque® CR-90, Tipaque® CR-93, Tipaque® CR-95, Tipaque® CR-97, Tipaque® CR-60, Tipaque® CR-63, Tipaque® CR-67, Tipaque® CR-58, Tipaque® CR-85 and Tipaque® UT771 (manufactured by ISHIHARA SANGYO KAISHA, LTD.), and Ti-Pure® R-100, Ti-Pure® R-101, Ti-Pure® R-102, Ti-Pure® R-103, Ti-Pure® R-104, Ti-Pure® R-105, Ti-Pure® R-108, Ti-Pure® R-900, Ti-Pure® R-902, Ti-Pure® R-960, Ti-Pure® R-706 and Ti-Pure® R-931 (manufactured by DuPont), produced by the chlorine method, can be more preferably used.

As such anatase type titanium oxide, known one can be used. As commercially available anatase type titanium oxide, there can be used TITON A-110, TITON TCA-123E, TITON A-190, TITON A-197, TITON SA-1 and TITON SA-1L (manufactured by SAKAI CHEMICAL INDUSTRY CO., LTD.), TA-100, TA-200, TA-300, TA-400, TA-500 and TP-2 (manufactured by Fuji Titanium Industry Co., Ltd.), TITANIX JA-1, TITANIX JA-3, TITANIX JA-4, TITANIX JA-5 and TITANIX JA-C (manufactured by TAYCA), KA-10, KA-15, KA-20 and KA-30 (manufactured by Titan Kogyo, Ltd.), Tipaque® A-100, Tipaque® A-220 and Tipaque® W-10 (manufactured by ISHIHARA SANGYO KAISHA, LTD.), and the like.

The amount of the white pigment compounded has a large effect on the absorbance and is preferably 3 to 50 parts by mass, more preferably 5 to 30 parts by mass, particularly preferably 5 to 25 parts by mass, in 100 parts by mass of the curable composition. When the amount of the white pigment is 3 parts by mass or more, the reflection rate of the composition is sufficient. When the amount is 50 parts by mass or less, an excessive increase in the viscosity of the composition and a reduction in printability can be suppressed.

When a black pigment is included as the colorant, carbon, aniline black, iron oxide, and the like can be used. The amount of the black pigment compounded has a large effect on the absorbance and is preferably 3 to 50 parts by mass, more preferably 5 to 30 parts by mass, particularly preferably 5 to 25 parts by mass, in 100 parts by mass of the curable composition.

Herein, a known dye may be included as the colorant, and examples include a phthalocyanine-based dye, an anthraquinone-based dye, and an azo-based dye.

[Wet Dispersant]

The curable composition for inkjet of the present invention can include a wet dispersant. As such a wet dispersant, one having the effect of assisting in dispersion of a pigment can be commonly used. As such a wet dispersant, a compound, having a polar group such as a carboxyl group, a hydroxyl group or an acid ester, or a high molecular weight compound, for example, an acid-containing compound such as phosphoric acid ester, a copolymerized product including an acid group, a hydroxyl group-containing polycarboxylic acid ester, polysiloxane, a salt of a long-chain poly aminoamide with an acid ester, and the like can be used.

Among these wet dispersants, one having an acid value is preferable because of being more effective for dispersion of an inorganic pigment such as titanium oxide.

Specific examples of the wet dispersant having an acid value include Anti-Terra-U, Anti-Terra-U 100, Anti-Terra-204, Anti-Terra-205, Disperbyk®-101, Disperbyk®-102, Disperbyk®-106, Disperbyk®-110, Disperbyk®-111, Disperbyk®-130, Disperbyk®-140, Disperbyk®-142, Disperbyk®-145, Disperbyk®-170, Disperbyk®-171, Disperbyk®-174, Disperbyk®-180, Disperbyk®-2001, Disperbyk®-2025, Disperbyk®-2070, Disperbyk®-2096, BYK®-P104, BYK®-P104S, BYK®-P105, BYK®-9076 and BYK®-220S (all are manufactured by BYK Chemie).

In such a wet dispersant having an acid value, the acid value is preferably 10 to 300 mgKOH/g.

The amount of the wet dispersant compounded is preferably 5 to 75 parts by mass with respect to 100 parts by mass of the colorant.

The curable composition for inkjet of the present invention can include a surface tension adjuster. The amount of the surface tension adjuster compounded is preferably 0.01 to 5 parts by mass with respect to 100 parts by mass of the composition.

Not only the above components, but also conventionally known additives such as a surfactant, a matting agent, a polyester-based resin, a polyurethane-based resin, a vinyl resin, an acrylic resin, a rubber resin and waxes which are for adjusting film properties, at least one of silicone-based, fluorine-based and polymer-based defoamers and leveling agents, an adhesiveness imparting agent such as an imidazole-based, thiazole-based or triazole-based adhesiveness imparting agent, and a silane coupling agent can be, if necessary, compounded in the curable composition for inkjet of the present invention.

Furthermore, not only the above components, but also a resin can be compounded in the curable composition for inkjet of the present invention as long as properties are not impaired. While a conventionally known resin can be used as such a resin, a (meth)acrylate compound having a polyene backbone is preferable. The polyene backbone can be preferably formed by, for example, polymerization using polybutadiene or isoprene, or both thereof, and is particularly preferably configured from a repeating unit represented by general formula (I):

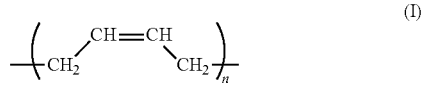
(I)

wherein n denotes 10 to 300. The olefinic double bond of such a repeating unit imparts flexibility to a curable resist composition for a printed wiring board, resulting in an increase in followability to a substrate, to thereby provide favorable adhesiveness.

The polyene backbone of the (meth)acrylate compound preferably has 50% or more, more preferably 80% or more of the repeating unit represented by the general formula (I).

Furthermore, the polyene backbone of the (meth)acrylate compound may include a unit represented by the following general formula (II):

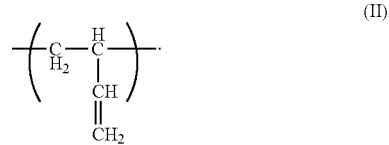
(II)

As a specific example, the following materials are preferably used: namely, liquid polybutadiene urethane (meth) acrylate obtained by a urethane addition reaction of 2-hydroxyethyl (meth)acrylate with a hydroxyl group of liquid polybutadiene via 2,4-tolylene diisocyanate, liquid polybutadiene acrylate obtained by an esterification reaction of 2-hydroxyacrylate with maleated polybutadiene to which maleic anhydride is added, liquid polybutadiene (meth) acrylate obtained by an esterification reaction of a carboxyl group of maleated polybutadiene with glycidyl (meth)acrylate, liquid polybutadiene (meth)acrylate obtained by an esterification reaction of (meth)acrylic acid with epoxylated polybutadiene obtained by action of an epoxylating agent on liquid polybutadiene, liquid polybutadiene (meth)acrylate obtained by a dechlorination reaction of liquid polybutadiene having a hydroxyl group, with (meth)acrylic acid chloride, and liquid hydrogenated 1,2-polybutadiene (meth)acrylate obtained by modification of liquid hydrogenated 1,2-polybutadiene glycol, obtained by hydrogenation of an unsaturated double bond of liquid polybutadiene having a hydroxyl group at both ends of the molecule, with urethane (meth)acrylate.

Examples of commercially available products include NISSO PB TE-2000, NISSO PB TEA-1000, NISSO PB TE-3000 and NISSO PB TEAI-1000 (all are manufactured by NIPPON SODA CO., LTD.), CN301, CN303 and CN307 (manufactured by SARTOMER), BAC-15 (manufactured by OSAKA ORGANIC CHEMICAL INDUSTRY LTD.), BAC-45 (manufactured by OSAKA ORGANIC CHEMICAL INDUSTRY LTD.), and EY RESIN BR-45UAS (manufactured by Light Chemical Industries Co., Ltd.).

The (meth)acrylate having a polyene backbone can be used singly or in combination of a plurality of kinds thereof.

Since the curable composition including the above respective components is for application to an inkjet method, the viscosity of the curable composition at 50° C. is preferably 5 to 50 mPa·s, more preferably 5 to 20 mPa·s. Thus, smooth printing can be made possible without any unnecessary load being applied to an inkjet printer.

The viscosity of the curable composition refers to a viscosity measured at normal temperature (25° C.) or 50° C. according to JIS K2283. When the viscosity is 150 mPa·s or less at normal temperature, or 5 to 50 mPa·s at 50° C., smooth printing can be made according to an inkjet printing method.

In addition, the maximum particle size of a particle included in the curable composition is preferably 0.1 to 5 μm or less, more preferably 0.1 to 1 μm. The maximum particle size is preferably 0.1 μm or more because a particle aggregation force is not too high, and the maximum particle size is preferably 5 μm or less because a problem such as nozzle clogging during inkjet printing can be less caused.

The maximum particle size of the particle included in the composition can be measured by a particle size distribution analyzer, and the D100 value is defined as the maximum particle size.

Furthermore, the curable composition has the above composition, and thus can be used as an ink for an inkjet system and can be subjected to printing onto, for example, a flexible wiring board by a roll-to-roll system. In this case, a base plate can be coated by an inkjet system and thereafter subjected to light irradiation by a light source for light irradiation, thereby allowing a cured coating film as a cured product to be formed.

The light irradiation is performed by irradiation with ultraviolet light or active energy ray, and is preferably performed by irradiation with ultraviolet light. As the light source for light irradiation, a low-pressure mercury lamp, a medium-pressure mercury lamp, a high-pressure mercury lamp, an ultrahigh-pressure mercury lamp, a xenon lamp, a metal halide lamp, an LED lamp, and the like are suitable. Besides them, electron beam, α-ray, β-ray, γ-ray, X-ray, neutron ray, and the like can also be utilized.

Furthermore, curing is, if necessary, made by heating after the light irradiation. Herein, the heating temperature is, for example, 70 to 200° C. Such a heating temperature range can allow for sufficient curing. The heating time is, for example, 10 to 100 minutes.

<Cured Product>

Furthermore, the curable composition can allow for formation of a pattern-cured product which is excellent in adhesiveness to a printed wiring board including a plastic base plate mainly made of polyimide or the like and a conductor circuit provided thereon, and which is excellent in various characteristics such as solder heat resistance, chemical resistance, solvent resistance, pencil hardness, electroless gold plating resistance and foldability.

<Printed Wiring Board>

A printed wiring board includes a cured product made of the curable composition, on a substrate having a circuit pattern. The printed wiring board can be produced by the following method.

First, a substrate with a circuit formed thereon is coated with the curable composition by an inkjet system, thereby forming a cured product having a pattern. When the curable composition here includes a photo base generator, the cured product is preferably heated after light irradiation for curing. The heating temperature is, for example, 70 to 200° C.

While the curable composition is suitable as a formation material of a cured product for a printed wiring board, it is particularly suitable as a formation material of a permanent film for a printed wiring board, and in particular, suitable as a formation material of a permanent insulation film, such as a solder resist. In addition, the curable composition of the present invention can also be used as a symbol marking material, a formation material of a coverlay, and a formation material of an interlayer insulation layer, which are to be formed on a substrate or a cured film.

EXAMPLES

Hereinafter, the present invention will be specifically described with illustrating Examples, but the present invention is not intended to be limited only to these Examples. Herein, "part(s)" means part(s) by mass unless particularly noted.

Components shown in Table 1 were compounded at each ratio (unit: part(s)) shown in the Table, and preliminarily mixed in a stirring machine to prepare each curable composition for inkjet.

The absorbance and coating film characteristics were evaluated with respect to the curable composition for inkjet prepared as described above, and the coating film thereof. The measurement results of the absorbance at a thickness of 10 μm are shown in Table 2, and coating film characteristics are shown in Table 3. Table 2 here shows the absorbance at a thickness of 10 μm, as measured by the following method. First, the curable composition for inkjet of each of Examples and Comparative Examples was diluted with tetrahydrofuran to 1/1000, and the absorbance thereof was measured by a spectrophotometer. A measurement cell having an optical path length of 1 cm was here used to thereby allow the same value as the absorbance at a thickness of 10 μm, of the composition before dilution, to be obtained.

TABLE 1

| | Example 1 | Example 2 | Example 3 | Example 4 | Example 5 | Example 6 | Comparative Example 1 | Comparative Example 2 | Comparative Example 3 | Comparative Example 4 | Comparative Example 5 |
|---|---|---|---|---|---|---|---|---|---|---|---|
| Alkylene chain-containing bifunctional (meth)acrylate compound (*1) | 83.00 | 83.00 | 83.00 | 83.00 | 75.00 | 77.80 | 83.00 | 83.00 | 83.00 | 83.00 | 83.00 |
| α-Amino-alkylphenone-based photopolymerization initiator (*2) | 4.80 | 7.20 | 9.60 | 14.40 | 7.20 | 4.80 | 7.20 | 21.60 | | 1.80 | 3.60 |
| Acylphosphine oxide-based photopolymerization initiator (*3) | 3.20 | 4.80 | 6.40 | 9.60 | 4.80 | 3.20 | | 14.40 | 4.80 | 1.20 | 2.40 |
| Bisphenol type epoxy(meth)acrylate compound (*4) | 18.00 | 18.00 | 18.00 | 18.00 | 18.00 | 18.00 | 18.00 | 18.00 | 18.00 | 18.00 | 18.00 |
| Hydroxyl group-containing (meth)acrylate compound (*5) | 4.20 | 4.20 | 4.20 | 4.20 | 4.20 | 4.20 | 4.20 | 4.20 | 4.20 | 4.20 | 4.20 |
| Thermosetting component (*6) | 12.00 | 12.00 | 12.00 | 12.00 | 12.00 | 12.00 | 12.00 | 12.00 | 12.00 | 12.00 | 12.00 |
| Colorant (*7) | | | | | 1.80 | 1.80 | | | | | |
| Colorant (*8) | | | | | 7.20 | 7.20 | | | | | |
| Surface tension adjuster (*9) | 0.12 | 0.12 | 0.12 | 0.12 | 0.12 | 0.12 | 0.12 | 0.12 | 0.12 | 0.12 | 0.12 |
| Σ | 125.20 | 129.20 | 133.20 | 141.20 | 130.20 | 129.00 | 124.40 | 153.20 | 122.00 | 122.00 | 123.20 |

(*1) 1,9-Nonanediol diacrylate (trade name NK Ester A-NOD-N, manufactured by SHIN NAKAMURA CHEMICAL CO., LTD.)
(*2) 2-Benzyl-2-dimethylamino-1-(4-morpholinophenyl)-butanone-1 (trade name IRGACURE ® 369, manufactured by BASF Japan Ltd.)
(*3) Bis(2,4,6-trimethylbenzoyl)-phenylphosphine oxide (trade name IRGACURE ® 819, manufactured by BASF Japan Ltd.)
(*4) Bisphenol A type epoxy acrylate (trade name NK Oligo EA-1010N, manufactured by SHIN NAKAMURA CHEMICAL CO., LTD.)
(*5) 4-Hydroxybutyl acrylate (trade name 4HBA, manufactured by Nihon Kasei CO., LTD.)
(*6) Trifunctional block isocyanate (trade name BI7982, manufactured by Baxenden Chemicals)
(*7) Phthalocyanine blue (FASTOGEN ® BLUE 5380)
(*8) Cromophtal Yellow (Y-AGR)
(*9) Polydimethylsiloxane-based additive (trade name BYK ® -307, manufactured by BYK Chemie)

TABLE 2

| Wavelength | Example 1 | Example 2 | Example 3 | Example 4 | Example 5 | Example 6 | Comparative Example 1 | Comparative Example 2 | Comparative Example 3 | Comparative Example 4 | Comparative Example 5 |
|---|---|---|---|---|---|---|---|---|---|---|---|
| 365 nm | 0.1 | 0.13 | 0.17 | 0.25 | 0.62 | 0.41 | 0.12 | 0.23 | 0.01 | 0.03 | 0.07 |
| 385 nm | 0.05 | 0.07 | 0.09 | 0.13 | 0.28 | 0.18 | 0.06 | 0.5 | 0.01 | 0.01 | 0.05 |

* Measurement of absorbance at a thickness of 10 μm

TABLE 3

| | Example 1 | Example 2 | Example 3 | Example 4 | Example 5 | Example 6 | Comparative Example 1 | Comparative Example 2 | Comparative Example 3 | Comparative Example 4 | Comparative Example 5 |
|---|---|---|---|---|---|---|---|---|---|---|---|
| Viscosity | ○ | ○ | ○ | ○ | ○ | ○ | ○ | X | X | ○ | ○ |
| IJ Printability | ○ | ○ | ○ | ○ | ○ | ○ | X | X | X | Δ | Δ |
| Surface curability | ○ | ◎ | ◎ | ◎ | ◎ | ◎ | Δ | ○ | X | ○ | X |
| Pattern blurring | ○ | ○ | ◎ | ◎ | ◎ | ◎ | X | ○ | X | X | Δ |
| Adhesiveness | ○ | ○ | ○ | ○ | ○ | ○ | X | ○ | X | X | Δ |
| Pencil hardness | ○ | ○ | ○ | ○ | ○ | ○ | X | Δ | X | X | X |
| Solder heat resistance | ○ | ○ | ○ | ○ | ○ | ○ | X | X | X | X | X |
| Gold plating resistance | ○ | ○ | ○ | ○ | ○ | ○ | X | X | X | X | Δ |

The viscosity in Table 3 is a value determined by measuring the viscosity at 50° C. and 100 rpm, of the curable composition for inkjet prepared according to compounding in each of Examples 1 to 6 and Comparative Examples 1 to 5 in Table 1, by a cone plate type viscometer (TVH-33H manufactured by TOKI SANGYO CO., LTD.).
○: 150 mPa·s or less at 25° C.
x: more than 150 mPa·s at 25° C.

The IJ printability in Table 3 was determined by confirming the state of injection through an inkjet head in inkjet printing, and evaluating it according to the following criteria.
○: favorable injection
Δ: not favorable injection, but injectable
x: not injectable <Lithography Conditions by Inkjet Printer>
Thickness: 20 μm
Apparatus: piezo type inkjet printer (a material printer DMP-2831 manufactured by FUJIFILM Global Graphic Systems Co., Ltd. was used (head temperature: 50° C.))

<UV Curing Conditions>
Amount of exposure: 1000 mJ/cm$^2$
Wavelength: 385 nm

The surface curability in Table 3 was determined by confirming the finger touch dryability (tackiness) of a cured coating film in a pattern formed in inkjet printing, and evaluating it according to the following criteria.
◎: there was no tackiness on the coating film surface.
○: stickiness and tackiness were confirmed on the coating film surface.
Δ: slimy was observed on the coating film surface.
x: the coating film surface was not cured and was in the form of a liquid.

In addition, the pattern blurring was determined by observing and measuring the width of blurring occurring from the boundary line between the cured coating film and copper foil as an underlying base plate towards the underlying base plate in a pattern formed in inkjet printing, by an optical microscope, and evaluating it according to the following criteria. Herein, the underlying base plate used was a copper-clad laminate (FR-4, 150 mm×95 mm×1.6 mm) for a printed wiring board.

◎: the width of blurring was 0 to 10 μm
○: the width of blurring was 11 to 20 μm
Δ: the width of blurring was 21 to 30 μm
x: the width of blurring was more than 30 μm In addition, the adhesiveness was determined by coating copper foil with the curable composition at a thickness of 30 μm by an inkjet coating apparatus to perform curing at an amount of exposure of 150 mJ/cm$^2$ by use of a high-pressure mercury lamp (HMW-713 manufactured by ORC MANUFACTURING CO., LTD.), thereafter performing a heating treatment in a hot air circulation type drying furnace at 150° C. for 60 minutes and performing a cross-cut tape peeling test of a sample thus obtained, and performing evaluation according to the following criteria.
○: no peeling.
Δ: slight peeling.
x: peeling.

Pencil Hardness
The same sample as that obtained in the adhesiveness test was used, and the pencil hardness on the surface of the cured coating film was measured according to JIS K 5600-5-4.
○: the hardness was 3H or more
x: the hardness was 2H or less Solder Heat Resistance
The same sample as that obtained in the adhesiveness test was used, and the state of the cured coating film, after the coating film was dipped in a solder bath at 260° C. for 10 seconds and a peeling test was then performed by an adhesive cellophane tape, according to the method of JIS C 5012, was visually observed, and evaluated according to the following criteria.
Evaluation Criteria
○: the coating film was neither peeled nor swollen.
x: the coating film was peeled and/or swollen.

Electroless Gold Plating Resistance
The same sample as that obtained in the adhesiveness test was used, the cured coating film was plated in conditions of nickel: 0.5 μm and gold: 0.03 μm; by use of commercially available electroless nickel plating bath and electroless gold plating bath, and the state of the resulting cured coating film surface was observed. The evaluation criteria are as follows.

Evaluation Criteria

◯: no change was observed.

Δ: whitening or clouding occurred.

x: whitening or clouding remarkably occurred.

As clear from Table 3, Examples 1 to 6 where the components in the present invention were included were excellent in surface curability, caused no pattern blurring, were also excellent in adhesiveness, and furthermore were excellent in coating film characteristics. On the contrary, Comparative Example 1 where no acylphosphine oxide-based photopolymerization initiator was included was confirmed to be inferior in IJ printability, surface curability, pattern blurring, adhesiveness, pencil hardness, solder heat resistance and gold plating resistance. Comparative Example 2 where the absorbance at 385 nm was high was confirmed to be inferior in viscosity, inkjet printability, solder heat resistance and gold plating resistance. Comparative Example 3 where no α-aminoalkylphenone-based photopolymerization initiator was included and the absorbance at each of 365 nm and 385 nm was low was confirmed to be inferior in all characteristics. Comparative Example 4 where the absorbance at each of 365 nm and 385 nm was low was confirmed to be inferior in IJ printability, pattern blurring, adhesiveness, pencil hardness, solder heat resistance and gold plating resistance. Comparative Example 5 where the absorbance at 365 nm was low was confirmed to be inferior in IJ printability, surface curability, pattern blurring, adhesiveness, pencil hardness, solder heat resistance and gold plating resistance.

The invention claimed is:

1. A curable composition for inkjet, comprising:
   an alkylene chain-containing bifunctional (meth)acrylate compound;
   an α-aminoalkylphenone-based photopolymerization initiator;
   an acylphosphine oxide-based photopolymerization initiator;
   a bisphenol type epoxy (meth)acrylate compound;
   a hydroxyl group-containing (meth)acrylate compound; and
   a thermosetting component comprising a block isocyanate,
   wherein the hydroxyl group-containing (meth)acrylate compound comprises at least one monofunctional (meth)acrylate compound selected from the group consisting of 2-hydroxy-3-phenoxyethyl acrylate, 2-hydroxyethyl acrylate, 2-hydroxypropyl acrylate, 4-hydroxybutyl acrylate, and 1,4-cyclohexane dimethanol monoacrylate, the α-aminoalkylphenone-based photopolymerization initiator has a compounding rate that is higher than a compounding rate of the acylphosphine oxide-based photopolymerization initiator such that when the thickness is 10 μm, the curable composition has an absorbance which is 0.17 to 0.8 at a wavelength of 365 nm and 0.09 to 0.3 at a wavelength of 385 nm.

2. The curable composition for inkjet according to claim 1, wherein the alkylene chain-containing bifunctional (meth)acrylate compound has an alkylene chain including 4 to 12 carbon atoms.

3. The curable composition for inkjet according to claim 1, wherein the block isocyanate of the thermosetting component is in an amount of 1 to 30 parts by mass with respect to 100 parts by mass of the curable composition.

4. The curable composition for inkjet according to claim 1, wherein the curable composition has a viscosity at 50° C. of 50 mPa·s or less.

5. A cured product obtained by a process including curing the curable composition for inkjet according to claim 1.

6. A printed wiring board, comprising:
   the cured product of claim 5.

7. A cured product obtained by a process including curing the curable composition for inkjet according to claim 2.

8. A cured product obtained by a process including curing the curable composition for inkjet according to claim 3.

9. A cured product obtained by a process including curing the curable composition for inkjet according to claim 4.

10. A printed wiring board, comprising:
    the cured product of claim 7.

11. A printed wiring board, comprising:
    the cured product of claim 8.

12. A printed wiring board, comprising:
    the cured product of claim 9.

13. The curable composition for inkjet according to claim 1, wherein the block isocyanate of the thermosetting component is in an amount of 1 to 30 parts by mass with respect to 100 parts by mass of the curable composition and comprises a trifunctional block isocyanate.

14. The curable composition for inkjet according to claim 1, wherein the compounding rate of the α-aminoalkylphenone-based photopolymerization initiator is in a range of 1 to 10 parts by mass with respect to 100 parts by mass of the curable composition.

15. The curable composition for inkjet according to claim 1, wherein the alkylene chain-containing bifunctional (meth)acrylate compound has a compounding rate in a range of 20 to 90 parts by mass with respect to 100 parts by mass of the curable composition, and the compounding rate of the α-aminoalkylphenone-based photopolymerization initiator is in a range of 1 to 10 parts by mass with respect to 100 parts by mass of the curable composition.

16. The curable composition for inkjet according to claim 1, wherein the bisphenol type epoxy (meth)acrylate compound has a compounding rate in a range of 5 to 30 parts by mass with respect to 100 parts by mass of the curable composition, the alkylene chain-containing bifunctional (meth)acrylate compound has a compounding rate in a range of 20 to 90 parts by mass with respect to 100 parts by mass of the curable composition, and the compounding rate of the α-aminoalkylphenone-based photopolymerization initiator is in a range of 1 to 10 parts by mass with respect to 100 parts by mass of the curable composition.

17. The curable composition for inkjet according to claim 1, wherein the bisphenol type epoxy (meth)acrylate compound has a compounding rate in a range of 5 to 30 parts by mass with respect to 100 parts by mass of the curable composition, the hydroxyl group-containing (meth)acrylate compound has a compounding rate in a range of 1 to 20 parts by mass with respect to 100 parts by mass of the curable composition, the alkylene chain-containing bifunctional (meth)acrylate compound has a compounding rate in a range of 20 to 90 parts by mass with respect to 100 parts by mass of the curable composition, and the compounding rate of the α-aminoalkylphenone-based photopolymerization initiator is in a range of 1 to 10 parts by mass with respect to 100 parts by mass of the curable composition.

18. The curable composition for inkjet according to claim 1, wherein the bisphenol type epoxy (meth)acrylate compound has a compounding rate in a range of 5 to 30 parts by mass with respect to 100 parts by mass of the curable composition, the hydroxyl group-containing (meth)acrylate compound has a compounding rate in a range of 2 to 10 parts by mass with respect to 100 parts by mass of the curable composition, the alkylene chain-containing bifunctional (meth)acrylate compound has a compounding rate in a range of 20 to 90 parts by mass with respect to 100 parts by mass of the curable composition, and the compounding rate of the α-aminoalkylphenone-based photopolymerization initiator is in a range of 1 to 10 parts by mass with respect to 100 parts by mass of the curable composition.

19. The curable composition for inkjet according to claim 1, wherein the alkylene chain-containing bifunctional (meth)acrylate compound has a viscosity at 25° C. in a range of 5 to 50 mPa·s.

20. The curable composition for inkjet according to claim 17, wherein the alkylene chain-containing bifunctional (meth)acrylate compound has a viscosity at 25° C. in a range of 5 to 50 mPa·s.

* * * * *